(12) United States Patent
Resch

(10) Patent No.: US 10,437,678 B2
(45) Date of Patent: Oct. 8, 2019

(54) UPDATING AN ENCODED DATA SLICE

(71) Applicant: International Business Machines Corporation, Armonk, NY (US)

(72) Inventor: Jason K. Resch, Chicago, IL (US)

(73) Assignee: PURE STORAGE, INC., Mountain View, CA (US)

(*) Notice: Subject to any disclaimer, the term of this patent is extended or adjusted under 35 U.S.C. 154(b) by 0 days.

(21) Appl. No.: 16/163,788

(22) Filed: Oct. 18, 2018

(65) Prior Publication Data

US 2019/0050293 A1    Feb. 14, 2019

Related U.S. Application Data

(63) Continuation-in-part of application No. 13/611,533, filed on Sep. 12, 2012.

(Continued)

(51) Int. Cl.
*G06F 12/00* (2006.01)
*G06F 11/10* (2006.01)
(Continued)

(52) U.S. Cl.
CPC ...... *G06F 11/1092* (2013.01); *G06F 11/1076* (2013.01); *H03M 13/13* (2013.01); *H03M 13/1515* (2013.01); *H03M 13/373* (2013.01); *H03M 13/616* (2013.01); *H04L 67/1097* (2013.01); *G06F 2211/104* (2013.01); *G06F 2211/1028* (2013.01)

(58) Field of Classification Search
CPC ......... G06F 12/0646; G06F 2212/1008; G06F 2212/657; G06F 11/1453; G06F 3/0608; G06F 3/0641; G06F 17/30156; G06F 17/30159; G06F 11/1076
See application file for complete search history.

(56) References Cited

U.S. PATENT DOCUMENTS 4,092,732 A    5/1978  Ouchi
5,454,101 A    9/1995  Mackay et al.
(Continued)

OTHER PUBLICATIONS

Chung; An Automatic Data Segmentation Method for 3D Measured Data Points; National Taiwan University; pp. 1-8; 1998.
(Continued)

*Primary Examiner* — Arvind Talukdar
(74) *Attorney, Agent, or Firm* — Garlick & Markison; Edward J. Marshall

(57) ABSTRACT

A distributed storage (DS) processing unit distributes an initial set of encoded data slices and an initial parity slice, for storage in multiple DS units. The initial parity slice is associated with an initial encoded data slice stored in a first DS unit. The DS processing unit transmits an updated encoded data slice reflecting changes to the initial encoded data slice, and obtains, from the first DS unit, delta parity information associated with a delta parity slice. The delta parity slice reflects differences between parity values calculated using the updated data slice and the initial data slice. An updated parity slice is generated by performing an exclusive OR (XOR) operation on the initial parity slice and the delta parity slice. A message transmitted to a second DS unit, which currently stores the initial parity slice, directs the second DS unit to store the updated parity slice.

20 Claims, 7 Drawing Sheets

Related U.S. Application Data

(60) Provisional application No. 61/554,358, filed on Nov. 1, 2011.

(51) Int. Cl.
*H04L 29/08* (2006.01)
*H03M 13/00* (2006.01)
*H03M 13/37* (2006.01)
*H03M 13/13* (2006.01)
*H03M 13/15* (2006.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,574,657 B1 | 6/2003 | Dickinson |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 8,041,641 B1 | 10/2011 | Panchbudhe et al. |
| 8,572,055 B1 | 10/2013 | Wu et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2008/0155169 A1 | 6/2008 | Hiltgen et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2010/0250858 A1 | 9/2010 | Cremelie et al. |
| 2014/0297951 A1* | 10/2014 | Baptist .................. G06F 3/0631 711/114 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

(56) References Cited

OTHER PUBLICATIONS

Zeilenga; Lightweight Directory Access Protocol (LDAP): String Representation of Distinguished Names; IETF Network Working Group; RFC 4514; Jun. 2006; pp. 1-15.

* cited by examiner

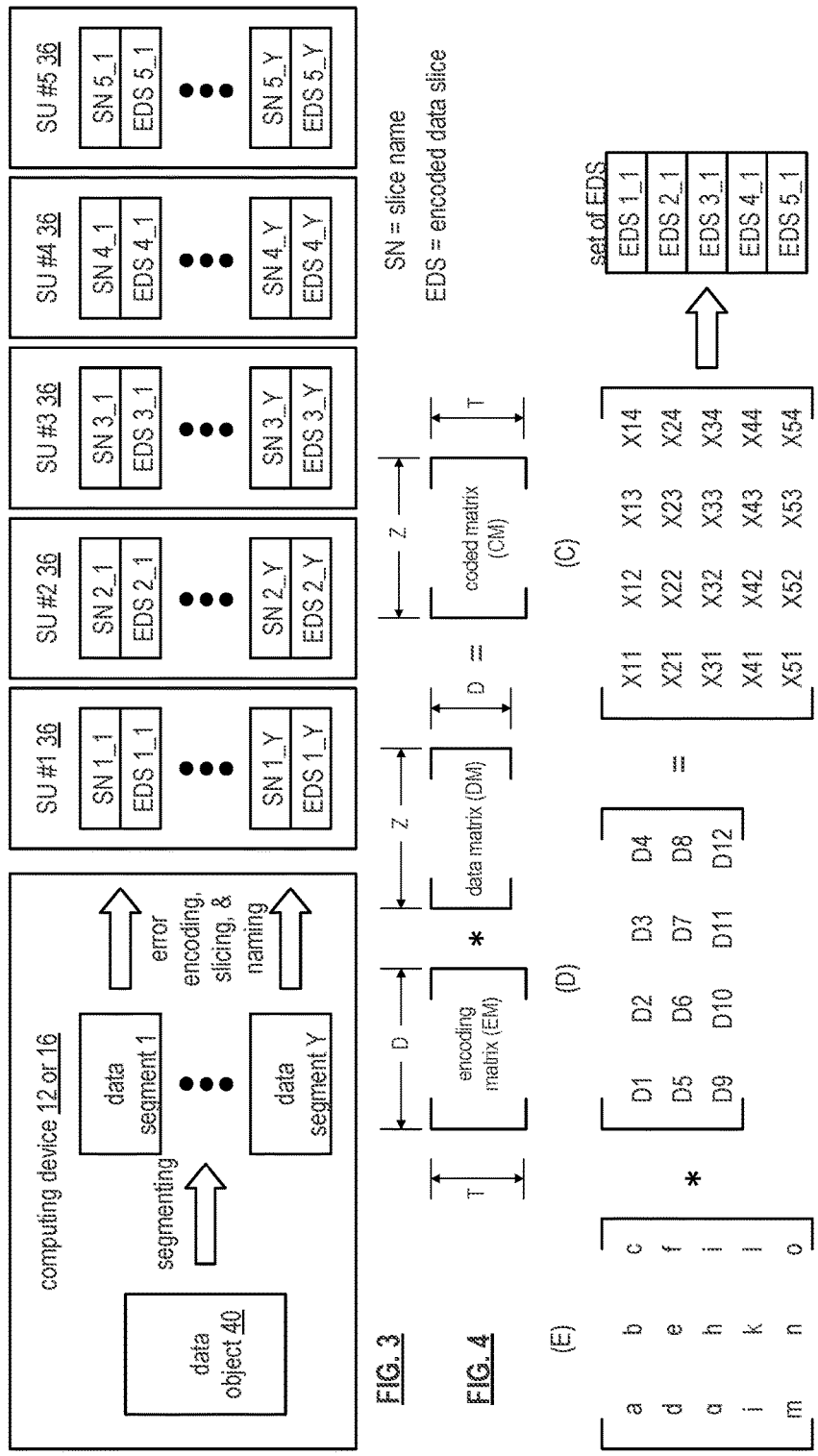

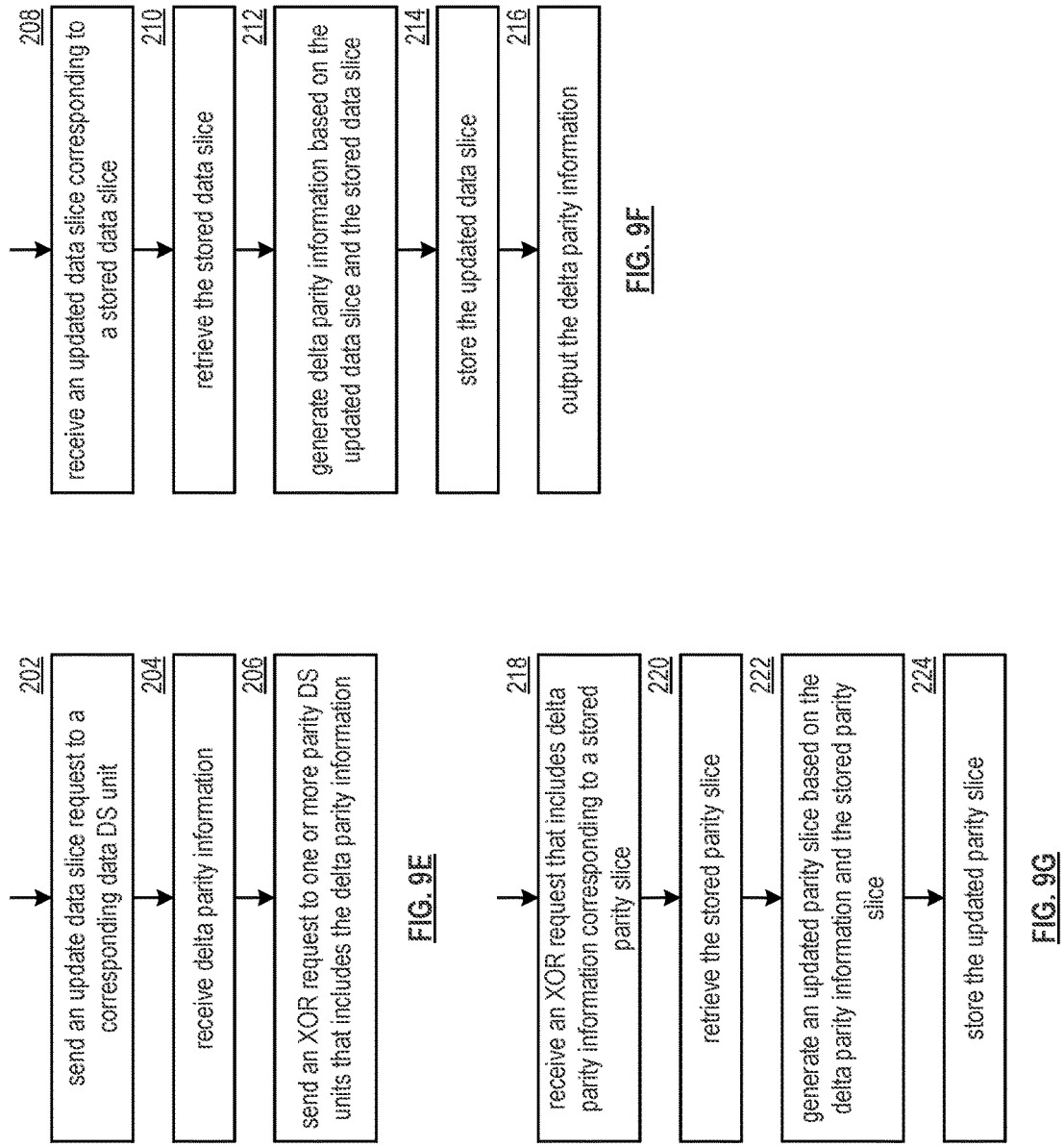

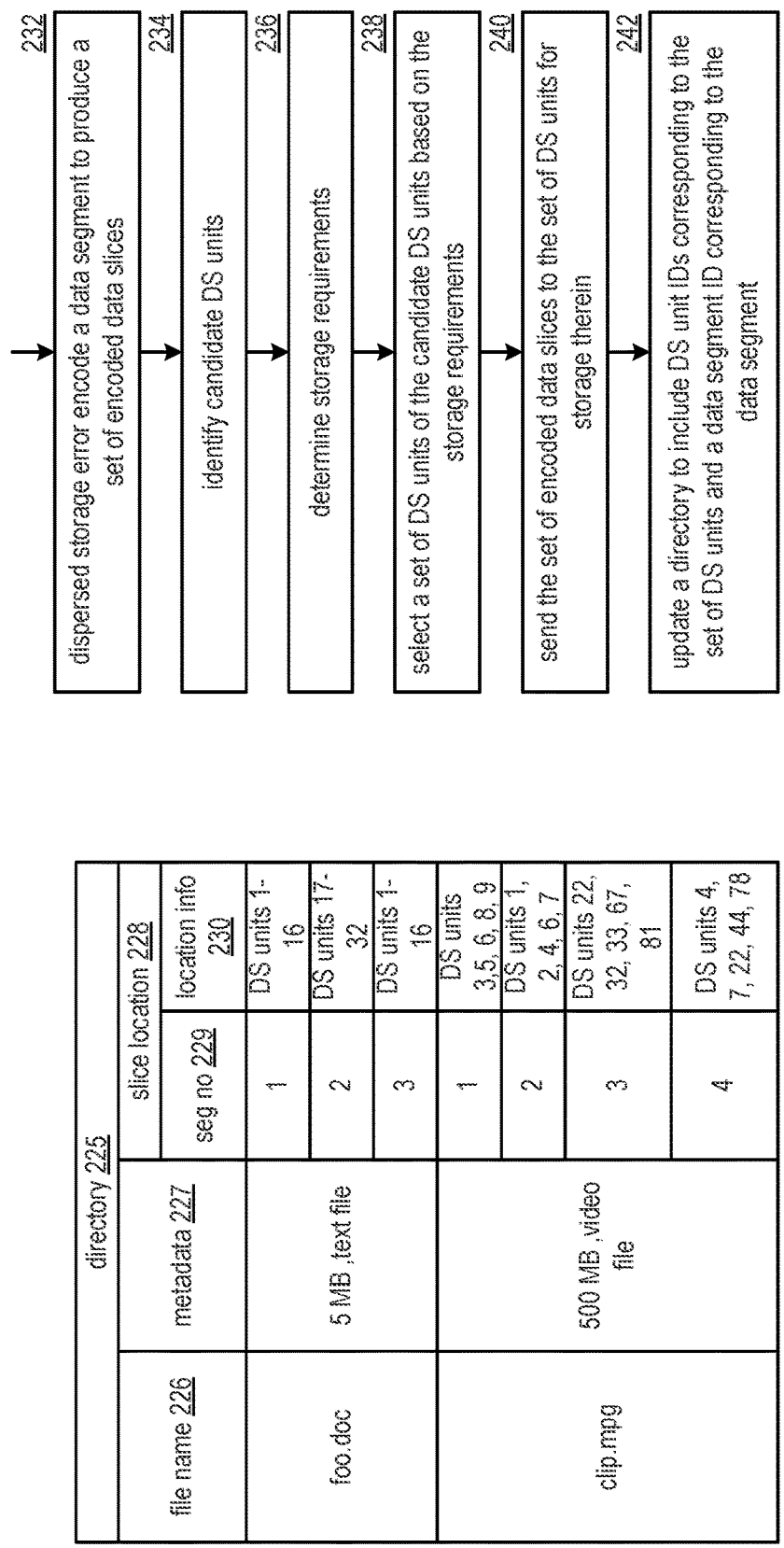

UPDATING AN ENCODED DATA SLICE

CROSS-REFERENCE TO RELATED APPLICATIONS

This application claims priority pursuant to 35 U.S.C. § 120 as a continuation-in-part of U.S. Utility application Ser. No. 13/611,533, entitled "COPYING DATA IN A DISPERSED STORAGE NETWORK WITHOUT REPLICATION", filed Sep. 12, 2012, which claims priority pursuant to 35 U.S.C. § 119(e) to U.S. Provisional Application No. 61/554,358, entitled "ACCESSING A DISPERSED STORAGE NETWORK", filed Nov. 1, 2011, all of which are incorporated herein by reference in its entirety and made part of the present U.S. Utility Patent Application for all purposes.

BACKGROUND

Technical Field

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers. In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE DRAWINGS

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 9E is a flowchart illustrating an example of updating data storage in accordance with the present invention;

FIG. 9F is a flowchart illustrating an example of storing updated data in accordance with the present invention;

FIG. 9G is a flowchart illustrating an example of generating an updated parity slice in accordance with the present invention;

FIG. 10A is a diagram illustrating an example of a directory in accordance with the present invention; and FIG. 10B is a flowchart illustrating an example of storing data in accordance with the present invention.

DETAILED DESCRIPTION

Figure 1:
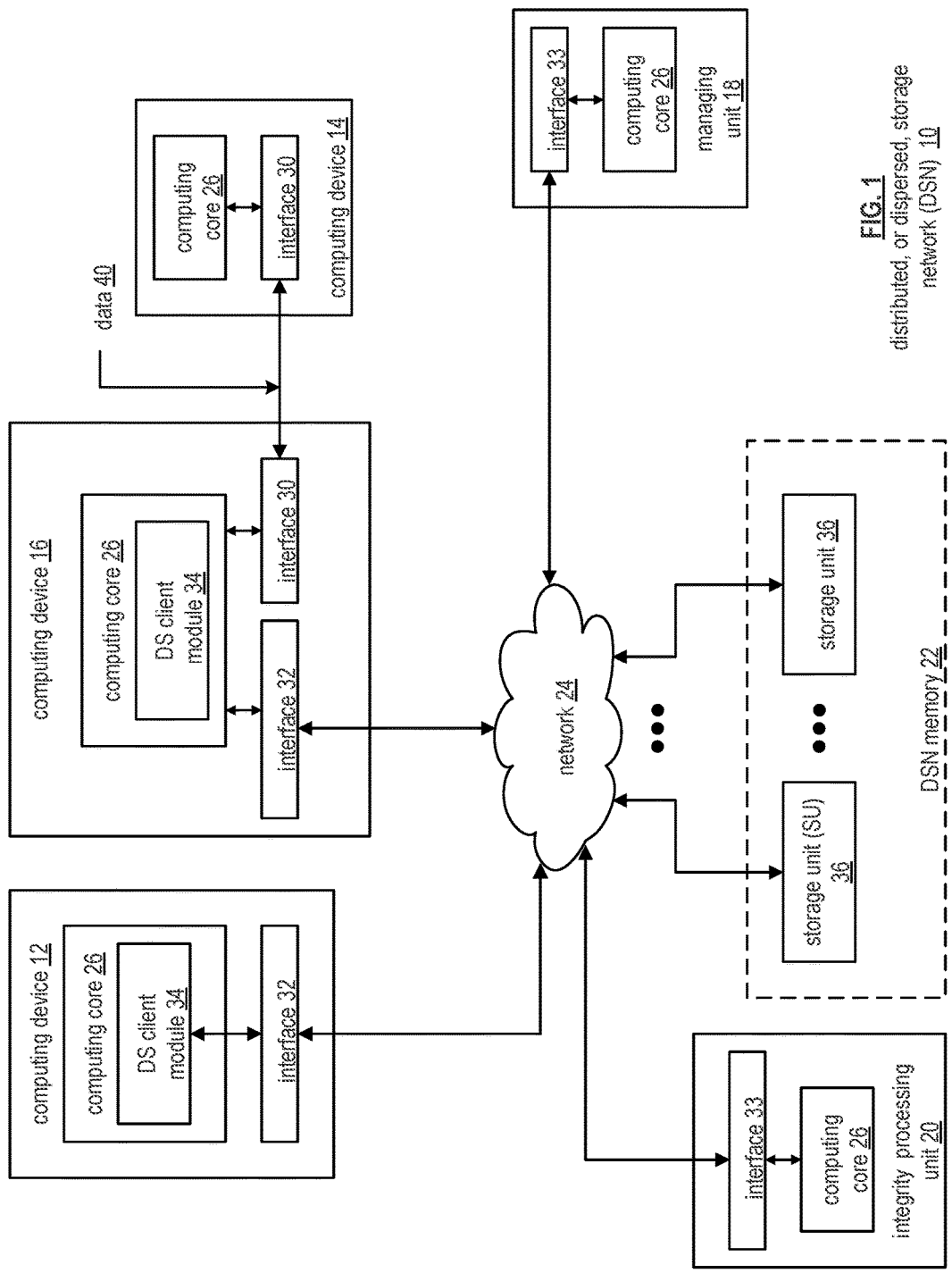
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
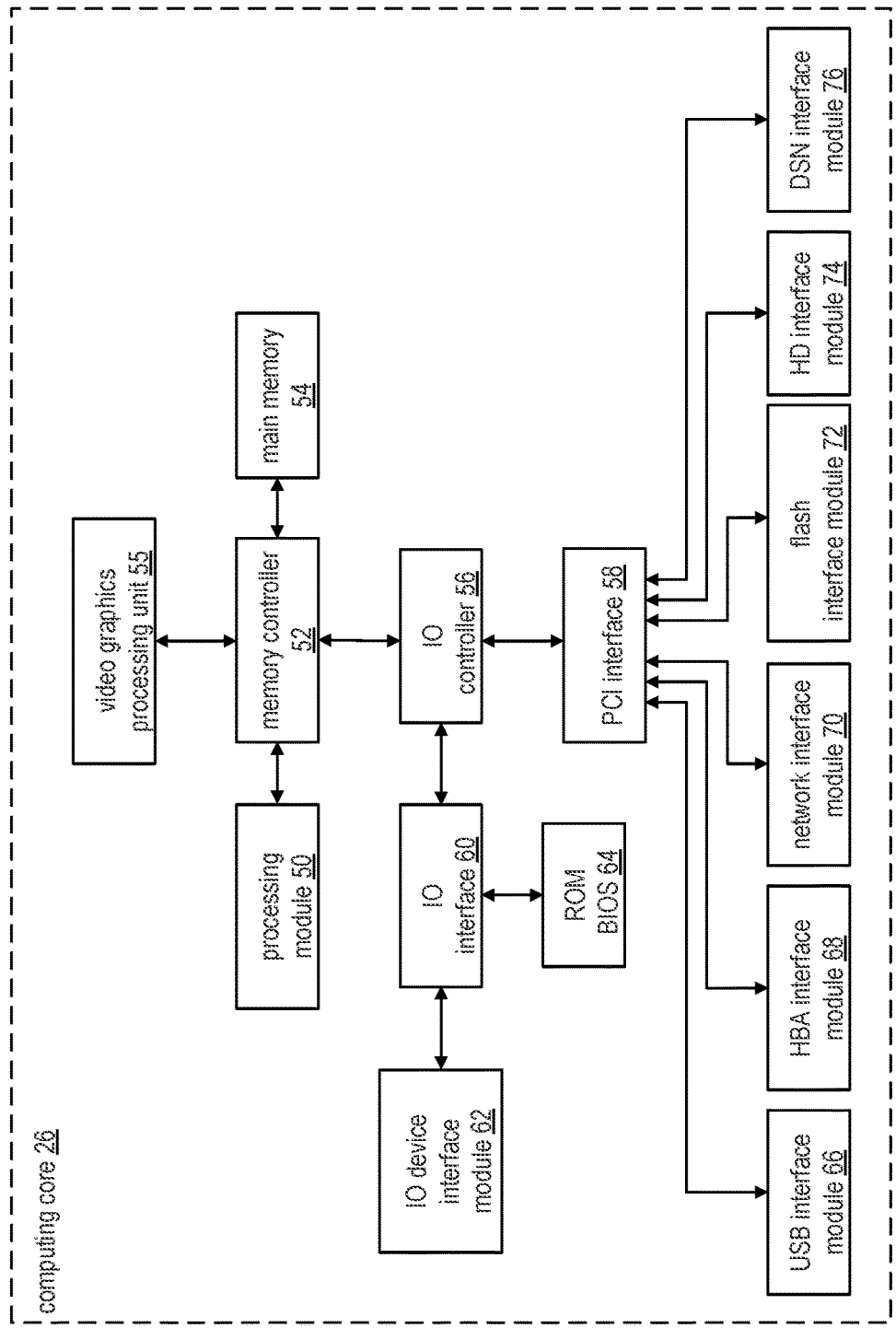
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/ or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
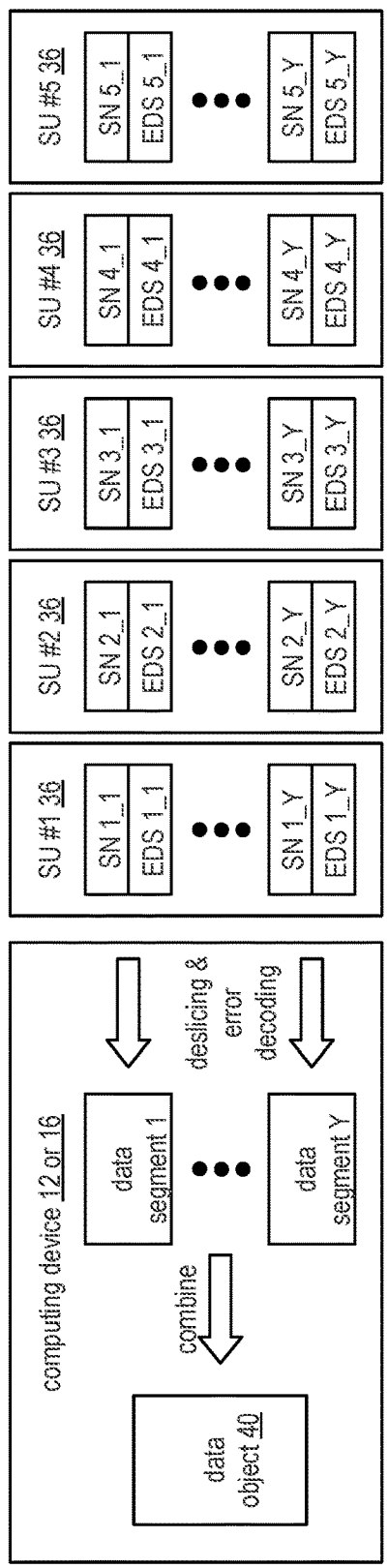
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
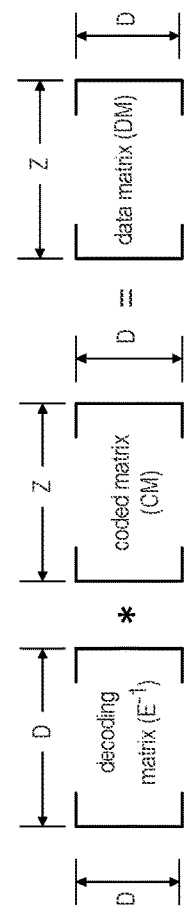
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

FIGS. 9A-10B illustrate various systems, devices, and techniques that can be used to update a previously stored encoded data slice. In various implementations, a command to send data to be used in an exclusive OR (XOR) operation over an existing slice (without having to read it back, XOR it, and send it back) is disclosed. Note that in some embodiments, any additive operation (e.g. add or subtract) performed within a finite field can be used. Examples of such finite fields include prime fields, Galois fields, or other closed sets that perform operations across all elements in a closed set. Optionally a new slice with a new name can be generated from the data. Using the XOR operation, as described herein, supports efficient updates of code slices, using partial rebuilding math, without having to read the original content of the slice first. This technique can leverage slice cloning to create an altogether new set of slices, and can provide extremely efficient partial updates of objects without having to read or write data that does not change. Also, although systems and techniques employing systematic erasure codes may realize the greatest improvement in efficiency, even systems and techniques that employ encoding techniques other than systematic erasure codes can achieve improved system performance.

Figure 9B:
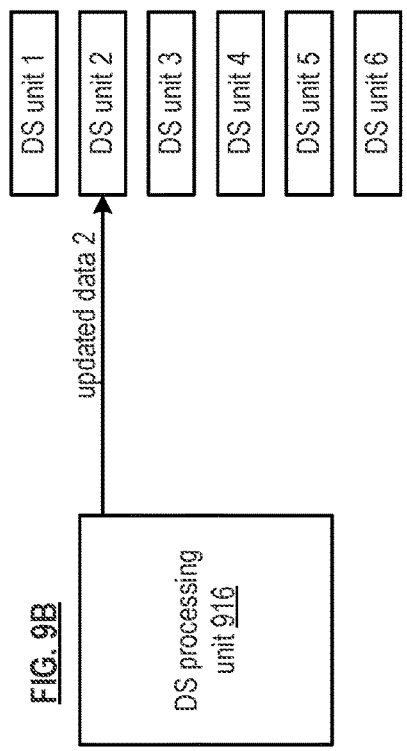
FIG. 9B is a schematic block diagram of another embodiment of a computing system of a second step of a data update scenario in accordance with the present invention.
Figure 9D:
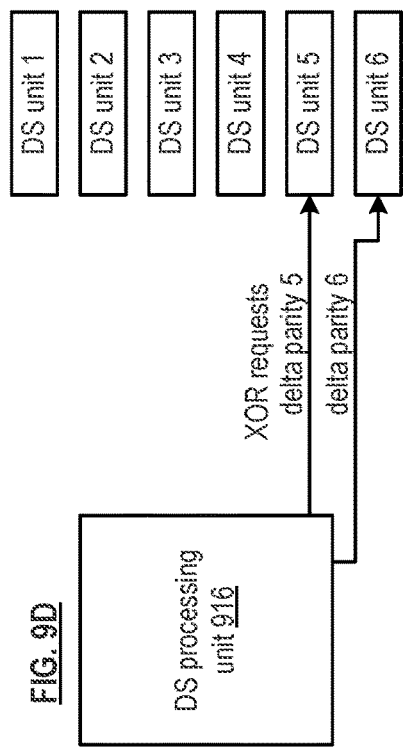
FIG. 9D is a schematic block diagram of another embodiment of a computing system of a fourth step of a data update scenario in accordance with the present invention.
Figure 9A:
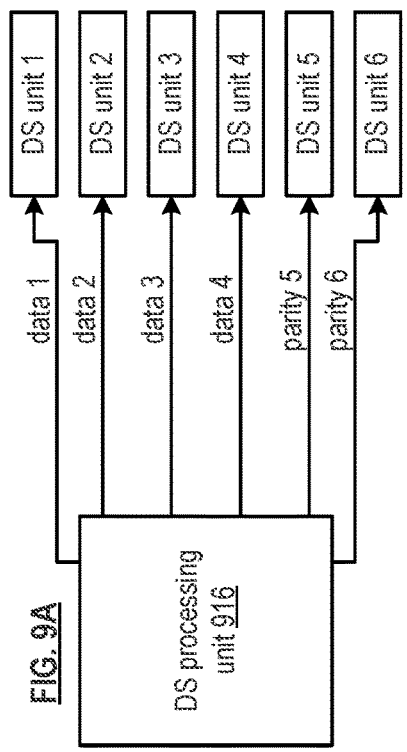
FIG. 9A is a schematic block diagram of another embodiment of a computing system of a first step of a data update scenario in accordance with the present invention.

FIG. 9A is a schematic block diagram of another embodiment of a computing system that includes a dispersed storage (DS) processing unit 916, which can be implemented using computing devices 12 or 16 of FIG. 1; and a set of DS units 1-6, which can be implemented using storage unit 36 of FIG. 1. A first step of a data update scenario includes the DS processing unit 916 generating and storing data as data 1-4 and generates and stores parity of the data as parity 5-6 in DS units 1-6. The generating of data 1-4 and parity 5-6 is in accordance with a data encoding function. The data encoding function includes utilizing an encoding matrix. The encoding matrix may be associated with a systematic erasure code and may include a unity square matrix (e.g., a first decode threshold number of rows each includes a one in a single column of a decode threshold number of columns producing a diagonal string of one's) and includes a width number minus the decode threshold number of parity rows (e.g., a Vandermonde matrix). The parity rows include encoding matrix entries in accordance with the data encoding function.

The generation of data 1-4 and parity 5-6 includes matrix multiplying the encoding matrix by the data to produce a width number of encoded data slices. The encoded data slices 1-4 produce data 1-4 and encoded data slices 5-6 produce parity 5-6. The storing of the data includes sending data 1 to DS unit 1 for storage therein, sending data 2 to DS unit 2 for storage therein, sending data 3 to DS unit 3 for storage therein, sending data 4 to DS unit 4 for storage therein, sending parity 5 to DS unit 5 for storage therein, and sending parity 6 to DS unit 6 for storage therein.

FIG. 9B is a schematic block diagram of another embodiment of a computing system that includes a dispersed storage (DS) processing unit 916 and a set of DS units 1-6. A second step of a data update scenario includes the DS processing unit 916 obtaining an updated portion of data to produce updated data and sending an updated data storage request message to a corresponding DS unit to replace a corresponding portion of the data. The obtaining may include receiving the updated portion of data, receiving data that includes the updated portion of data, and analyzing data to detect the updated portion of data. The storage request message may include one or more of the updated data, encoding information, and a request for delta parity information. The encoding information may include one or more of an encoding matrix, a width, and a decode threshold. For example, the DS processing unit 916 receives an updated portion of data corresponding to a second portion of data to produce updated data 2 (e.g., slice 2) and sends a storage request message to DS unit 2 that includes the updated data 2.

Figure 9C:
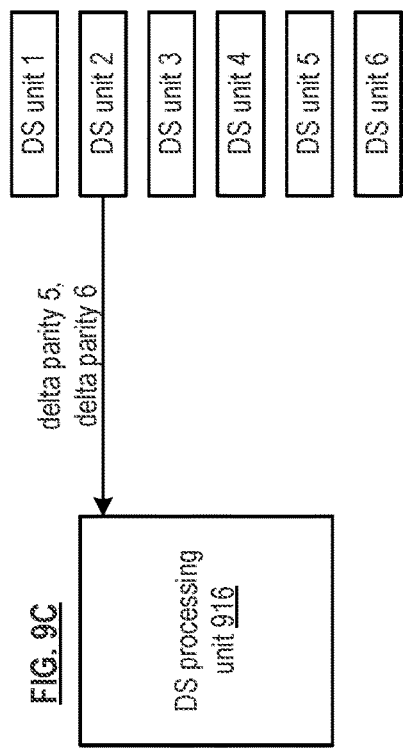
FIG. 9C is a schematic block diagram of another embodiment of a computing system of a third step of a data update scenario in accordance with the present invention.

FIG. 9C is a schematic block diagram of another embodiment of a computing system that includes a dispersed storage (DS) processing unit 916 and a set of DS units 1-6. A third step of a data update scenario includes the DS processing unit 916 generating delta parity information based on updated data, data (e.g., previous data which is being replaced by the updated data) and an encoding function, and sending the delta parity information to a corresponding DS processing unit 916. Alternatively, the DS unit sends the delta parity information directly to one or more other DS units associated with storage of parity information. For example, DS unit 2 generates the delta parity information to include delta parity 5 and delta parity 6 based on updated data 2, data 2, and the encoding function and sends the delta parity information to the DS processing unit 916. For instance, DS unit 2 generates the delta parity information in accordance with formulas delta parity 5=rebuilt partial (for parity 5 based on updated data 2) XOR rebuilt partial (for parity 5 based on data 2) and delta parity 6=rebuilt partial (for parity 6 based on updated data 2) XOR rebuilt partial (for parity 6 based on data 2) and sends the delta parity information to a corresponding DS processing unit 916. The DS unit 2 generates such a rebuilt partial (for parity 5 based on updated data 2) by multiplying an inverted square matrix of a unity matrix of an encoding matrix of the encoding function by a data matrix including the updated data 2 by a row of the encoding matrix corresponding to parity 5.

FIG. 9D is a schematic block diagram of another embodiment of a computing system that includes a dispersed storage (DS) processing unit 916 and a set of DS units 1-6. A fourth step of a data update scenario includes the DS processing unit 916 outputting one or more exclusive OR (XOR) requests to one or more DS units associated with storing parity information. The XOR requests includes delta parity information and a parity slice identifier, each of the one or more DS units generates and stores updated parity information based on the delta parity information, stored parity information, and encoding information. For example, the DS processing unit 916 sends an XOR request that includes delta parity 5 to DS unit 5 and sends an XOR request that includes delta parity 6 to DS unit 6. DS unit 5 retrieves parity 5 (e.g., from a local DS unit 5 memory), wherein parity 5 is associated with updated parity 5. DS unit 5 generates updated parity 5 in accordance with a formula updated parity 5=parity 5 XOR delta parity 5. DS unit 5 stores updated parity 5 (e.g., in the local memory), replacing parity 5. DS unit 6 retrieves parity 6 (e.g., from a local DS unit 6 memory). The parity 6 is associated with updated parity 6. DS unit 6 generates updated parity 6 in accordance with a formula updated parity 6=parity 6 XOR delta parity 6. DS unit 6 stores updated parity 6 (e.g., in the local DS unit 6 memory), replacing parity 6.

FIG. 9E is a flowchart illustrating an example of updating data storage. The method begins at step 202 where a processing module (e.g., of a dispersed storage (DS) processing unit) sends an update data slice request to a corresponding data DS unit. In some embodiments the update data slice request can include delta parity information. An updated data slice of the request is associated with a previously stored encoded data slice of a set of stored encoded data slices. The method continues at step 204 where the processing module receives delta parity information (e.g., from the corresponding data DS unit). The method continues at step 206 where the processing module sends the delta parity information to one or more parity DS units. The one or more parity DS units are associated with the storage of parity information associated with the set of stored encoded data slices.

FIG. 9F is a flowchart illustrating an example of storing updated data. The method begins at step 208 where a processing module (e.g., of a dispersed storage (DS) unit) receives an update data slice (e.g., updated data) request corresponding to a previously stored encoded data slice (e.g., data). The method continues at step 210 where the processing module retrieves the previously stored encoded data slice from a memory (e.g., associated with the data DS unit). The method continues at step 212 where the processing module generates delta parity information based on an updated encoded data slice of the request and the previously stored encoded data slice. For example, the processing module generates the delta parity information in accordance with formulas delta parity 5=rebuilt partial (for parity slice 5 based on updated data slice 2) exclusive OR (XOR) rebuilt partial (for parity slice 5 based on data slice 2) and delta parity 6=rebuilt partial (for parity slice 6 based on updated data slice 2) XOR rebuilt partial (for parity slice 6 based on data slice 2) when the delta parity information includes two parity slices.

The method continues at step 214 where the processing module stores the updated encoded data slice. Alternatively, or in addition to, the processing module replaces the encoded data slice with the updated data slice and/or deletes the data slice. The method continues at step 216 where the processing module outputs the delta parity information (e.g., to a corresponding DS processing unit associated with sending the updated data slice).

FIG. 9G is a flowchart illustrating an example of generating an updated parity slice. The method begins at step 218 where a processing module (e.g., of a parity dispersed storage (DS) unit) receives an exclusive OR (XOR) request that includes delta parity information and a parity slice name corresponding to a stored parity slice. The method continues at step 220 where the processing module retrieves the stored parity slice (e.g., from a local memory of the parity DS unit). The method continues at step 222 where the processing module generates an updated parity slice based on the delta parity information and the stored parity slice. For example, the processing module generates the updated parity slice in accordance with a formula updated parity slice 5=parity slice 5 XOR delta parity slice 5 when the DS unit is DS unit 5. The method continues at step 224 where the processing module stores the updated parity slice. Alternatively, or in addition to, the processing module replaces the parity slice with the updated data slice and/or deletes the parity slice.

FIG. 10A is a diagram illustrating an example of a directory structure 225 that includes a file name field 226, a metadata field 227, and a slice location field 228. The slice location field 228 includes a segment number field 229 and a location information field 228. The directory structure 225 includes a plurality of entries. Each entry of the plurality of entries is associated with a filename entry in the file name field 226. Each filename entry describes a user file system file name (e.g., a file name, and object name, a block number) of an associated file stored as a plurality of sets of encoded data slices in a dispersed storage network (DSN) memory. Each set of encoded data slices corresponds to a data segment of a plurality of data segments of data of the associated file.

The entry includes a metadata entry of the metadata field 227. Each metadata entry corresponds to a filename of the plurality of filenames. Each metadata entry may include one or more metadata values. The metadata values may include values associated with one or more of a data size indicator, a data type indicator, a creation date, an owner identifier (ID), permissions, a delete date, and storage requirements. For example, metadata associated with filename clip.mpg includes a data size indicator of 500 megabytes and a data type indicator of a video file. Alternatively, a plurality of metadata entries may correspond to a plurality of data segments of the data.

The entry includes one or more segment number entries in the segment number field 229. Each segment number entry corresponds to a filename and includes at least one of a segment number and a block number. For example, segment numbers 1-3 correspond to three data segments included in data of filename foo.doc and segment numbers 1-4 correspond to for data segments included in data of filename clip.mpg.

The entry includes one or more location entries in the location information field 228. Each location information entry includes location information associated with storage of a set of encoded data slices associated with a corresponding data segment. Each data segment may be stored in the DSN memory at a different location. The location information includes one or more of a set of dispersed storage (DS) unit identifiers (IDs), a set of internet protocol (IP) addresses corresponding to the set of DS units, a hostname, a site name, and a set of slice names corresponding to the set of encoded data slices. For example, a set of encoded data slices associated with data segment 2 of foo.doc is stored at DS units 17-32.

FIG. 10B is a flowchart illustrating an example of storing data. The method begins at step 232 where processing module (e.g., of a dispersed storage (DS) processing module) dispersed storage error encodes a data segment to produce a set of encoded data slices. The method continues at step 234 where the processing module identifies candidate DS units. The identifying may be based on one or more of a previously utilized DS unit identifier (ID), a DS unit list, and DS unit availability information. For example, the processing module identifies the candidate DS units to include DS units that are currently online and operational (e.g., available).

The method continues at step 236 where the processing module determines storage requirements. The determining may be based on one or more of metadata associated with the data segment which includes at least one of a storage requirement, a query to a requesting entity, a vault identifier (ID), a requirements lookup based on the vault ID, and receiving the storage requirements.

The method continues at step 238 where the processing module selects a set of DS units of the candidate DS units based on the storage requirements. The selecting may be based on one or more of a preferred DS unit list, received DS unit IDs, a user ID, a vault ID, a security level, a performance level, a data type, metadata, an estimated DS unit performance level, historical DS unit performance information, a DS unit availability indicator, and a DS unit capacity level. For example, the processing module selects the set of DS units that are associated with estimated DS unit performance levels that each compare favorably to a DS unit performance level threshold.

The method continues at step 240 where the processing module sends the set of encoded data slices to the set of DS units for storage therein. The method continues at step 242 where the processing module updates a directory. The updating includes modifying the directory to include one or more of DS unit IDs corresponding to the set of DS units, a data segment ID corresponding to the data segment, and a set of internet protocol (IP) addresses associated with the set of DS units. In an example of a retrieval method of operation, the processing module utilizes the filename to index into the directory to extract slice locations for each data segment, sends read requests to the slice locations, receives slices, and decodes the slices to reproduce the data.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprising:
distributing, by a distributed storage (DS) processing unit, an initial set of encoded data slices for storage in a plurality of DS units, the initial set of encoded data slices including initial encoded data slices and initial parity slices, wherein initial data used to generate the initial set of encoded data slices can be reconstructed using fewer than all encoded data slices included in the initial set of encoded data slices;
receiving updated data reflecting changes to the initial data;
generating an updated encoded data slice from the updated data, the updated encoded data slice generated using an encoding function;
storing the updated encoded data slice in a first DS unit;
generating delta parity information based on the updated data, the initial data, and the encoding function;
generating updated parity slices by performing an additive operation, within a finite field, using the delta parity information and the initial parity slices; and
storing the updated parity slices in at least a second DS unit.

2. The method of claim 1, further comprising:
transmitting an update-slice request from the DS processing unit to the first DS unit, the update-slice request including the delta parity information.

3. The method of claim 1, wherein:
generating the delta parity information includes generating rebuilt partial parity slices.

4. The method of claim 1, further comprising:
transmitting a message, from the DS processing unit, directing the second DS unit to store an updated parity slice, the message including information directing the second DS unit to generate the updated parity slice.

5. The method of claim 1, wherein:
the first DS unit transmits the delta parity information to at least one of the DS processing unit and the second DS unit.

6. The method of claim 1, wherein performing an additive operation within a finite field includes:
performing an exclusive OR (XOR) operation.

7. The method of claim 1, wherein:
generating the delta parity information is performed using an encoding matrix associated with a systematic erasure code.

8. A distributed storage network (DSN) comprising:
a distributed storage (DS) processing unit coupled via a network to a plurality of DS units configured to store encoded data slices;
the DS processing unit including a processor and associated memory, and configured to:
distribute an initial set of encoded data slices for storage in a plurality of DS units, the initial set of encoded data slices including initial encoded data slices and initial parity slices, wherein initial data used to generate the initial set of encoded data slices can be reconstructed using fewer than all encoded data slices included in the initial set of encoded data slices;
receive updated data reflecting changes to the initial data;
generate an updated encoded data slice from the updated data, the updated encoded data slice generated using an encoding function, and reflecting changes to an initial encoded data slice stored in a first DS unit;
transmit the updated encoded data slice to the first DS unit;
the first DS unit configured to:
store the updated encoded data slice;
transmit delta parity information to at least one of the DS processing unit or a second DS unit; and
the DS processing unit further configured to:
transmit, to the second DS unit, a message directing the second DS unit to store an updated parity slice, the updated parity slice generated by performing an additive operation, within a finite field, using the delta parity information and an initial parity slice stored in the second DS unit.

9. The distributed storage network (DSN) of claim 8, wherein the first DS unit is further configure to:
generate the delta parity information.

10. The distributed storage network (DSN) of claim 8, wherein the DS processing unit is further configure to:
generate the delta parity information; and
transmit the delta parity information to at least one of the first DS unit and the second DS unit.

11. The distributed storage network (DSN) of claim 8, wherein:
the delta parity information is generated based on rebuilt-partial parity slices.

12. The distributed storage network (DSN) of claim 8, wherein the message directing the second DS unit to store the updated parity slice includes:
information directing the second DS unit to generate the updated parity slice by performing an additive operation, within a finite field, using the delta parity information and the initial parity slice.

13. The distributed storage network (DSN) of claim 8, wherein:
the delta parity information is generated using an encoding matrix associated with a systematic erasure code.

14. The distributed storage network (DSN) of claim 8, wherein performing an additive operation within a finite field includes:
performing an exclusive OR (XOR) operation.

15. A distributed storage (DS) processing unit comprising:
a computing core;
memory coupled to the computing core;
a network interface configured to couple the computing core to a plurality of DS units;
the DS processing unit configured to:
generate an initial set of encoded data slices for storage in a plurality of DS units, the initial set of encoded data slices including initial encoded data slices and initial parity slices, wherein initial data used to generate the initial set of encoded data slices can be reconstructed using fewer than all encoded data slices included in the initial set of encoded data slices;
transmit an initial encoded data slice to a first DS unit for storage;
transmit an initial parity slice to a second DS unit for storage, wherein the initial parity slice is associated with the initial encoded data slice;
receive updated data reflecting changes to the initial data;
generate an updated encoded data slice from the updated data, the updated encoded data slice generated using an encoding function;
transmit the updated encoded data slice in a first DS unit for storage;
obtain delta parity information generated from the updated data, the initial data, and the encoding function; and
transmit, to the second DS unit, a message directing the second DS unit to store an updated parity slice, the updated parity slice generated by performing an additive operation, within a finite field, using the delta parity information and the initial parity slice.

16. The distributed storage (DS) processing unit of claim 15, further configured to:
obtain the delta parity information by generating the delta parity information.

17. The distributed storage (DS) processing unit of claim 15, further configured to:
obtain the delta parity information from the first DS unit.

18. The distributed storage (DS) processing unit of claim 15, wherein:
the delta parity information is generated based on rebuilt-partial parity slices.

19. The distributed storage (DS) processing unit of claim 15, wherein the message directing the second DS unit to store the updated parity slice includes:
information directing the second DS unit to generate the updated parity slice by performing an additive operation, within a finite field, using the delta parity information and the initial parity slice.

20. The distributed storage (DS) processing unit of claim 15, wherein:
the delta parity information is generated using an encoding matrix associated with a systematic erasure code; and
performing an additive operation within a finite field includes performing an exclusive OR (XOR) operation.

* * * * *